United States Patent
Thomas

(10) Patent No.: US 6,622,398 B2
(45) Date of Patent: Sep. 23, 2003

(54) METHOD OF OZONE CONVERSION IN SEMICONDUCTOR MANUFACTURING

(75) Inventor: Ralph Wayne Thomas, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/155,402

(22) Filed: May 22, 2002

(65) Prior Publication Data

US 2002/0139005 A1 Oct. 3, 2002

Related U.S. Application Data

(62) Division of application No. 09/384,077, filed on Aug. 26, 1999, now Pat. No. 6,408,535.

(51) Int. Cl.$^7$ .......................... F26B 3/34; H01L 21/302
(52) U.S. Cl. .............................. 34/278; 34/276; 34/378; 34/420; 34/428; 438/707; 438/715; 438/769
(58) Field of Search ..................... 34/275, 276, 278, 34/377, 378, 420, 428; 210/748, 760; 95/8; 438/707, 706, 715, 767, 769, 770

(56) References Cited

U.S. PATENT DOCUMENTS

| | | |
|---|---|---|
| 4,300,581 A | 11/1981 | Thompson |
| 4,749,640 A | 6/1988 | Tremont et al. |
| 5,095,927 A | 3/1992 | Thompson et al. |
| 5,186,907 A | 2/1993 | Yanagi et al. |
| 5,464,480 A | 11/1995 | Matthews |
| 5,558,158 A | 9/1996 | Elmore |
| 5,727,578 A | 3/1998 | Matthews |
| 5,776,296 A | 7/1998 | Matthews |
| 5,935,525 A | 8/1999 | Lincoln et al. |
| 5,961,920 A | 10/1999 | Söremark |
| 6,086,772 A | 7/2000 | Tanimura et al. |
| 6,336,998 B1 | 1/2002 | Wang |
| 6,485,808 B2 * | 11/2002 | Anzai et al. ................ 428/64.1 |
| 6,497,768 B2 * | 12/2002 | Bergman ........................ 134/3 |
| 6,506,257 B2 * | 1/2003 | Horiguchi et al. ........... 118/725 |
| 6,511,921 B1 * | 1/2003 | Panczyk et al. ............. 438/770 |
| 6,533,902 B1 * | 3/2003 | Miki et al. .............. 204/157.15 |
| 6,537,422 B2 * | 3/2003 | Sakuma et al. .......... 156/345.5 |
| 6,551,409 B1 * | 4/2003 | DeGendt et al. ................ 134/2 |

* cited by examiner

Primary Examiner—Pamela A Wilson
(74) Attorney, Agent, or Firm—Perkins Coie LLP

(57) ABSTRACT

A method for processing semiconductor wafers and similar articles has an ozone remover connected to a processing chamber. The ozone remover has a light chamber surrounded by reflectors. Ozone and other processing gases and vapors flow out of the processing chamber and into the light chamber. Ultraviolet lights in the ozone remover flood the light chamber with ultraviolet light, converting ozone into oxygen. The amount of ozone released into the environment is reduced. A recirculation line receives the gases and vapors flowing out of the ozone remover. Oxygen and any remaining ozone are separated from other gas and vapor components and are recycled back to an ozone generator, to increase the ozone generator efficiency in supplying the machine with ozone.

11 Claims, 5 Drawing Sheets

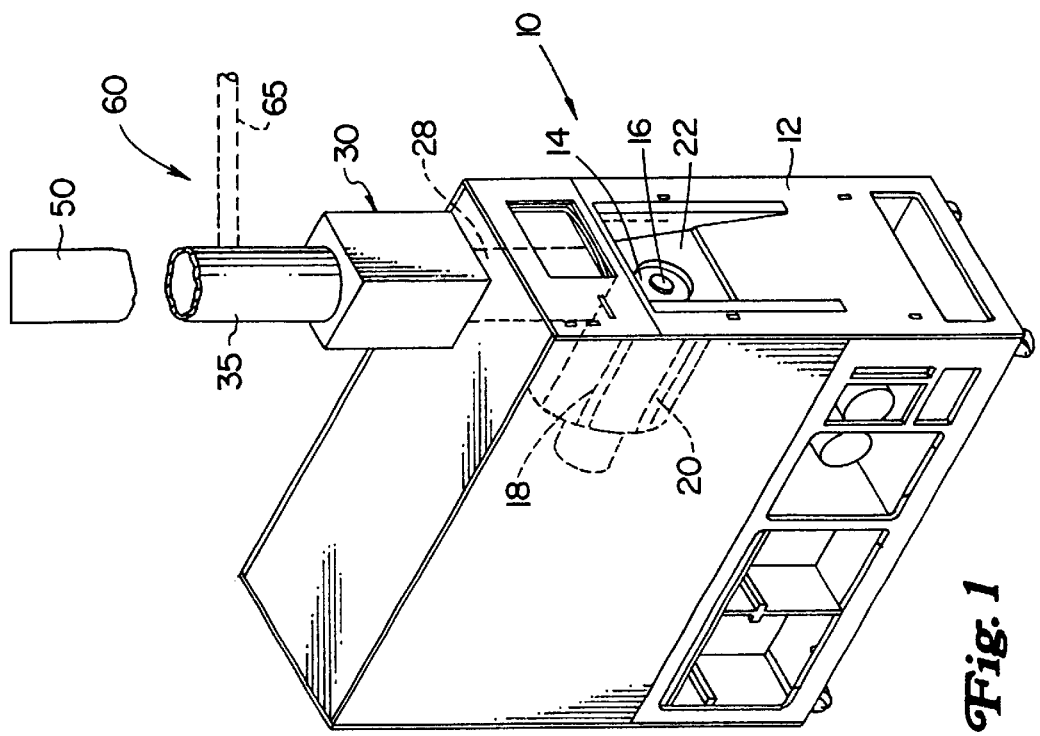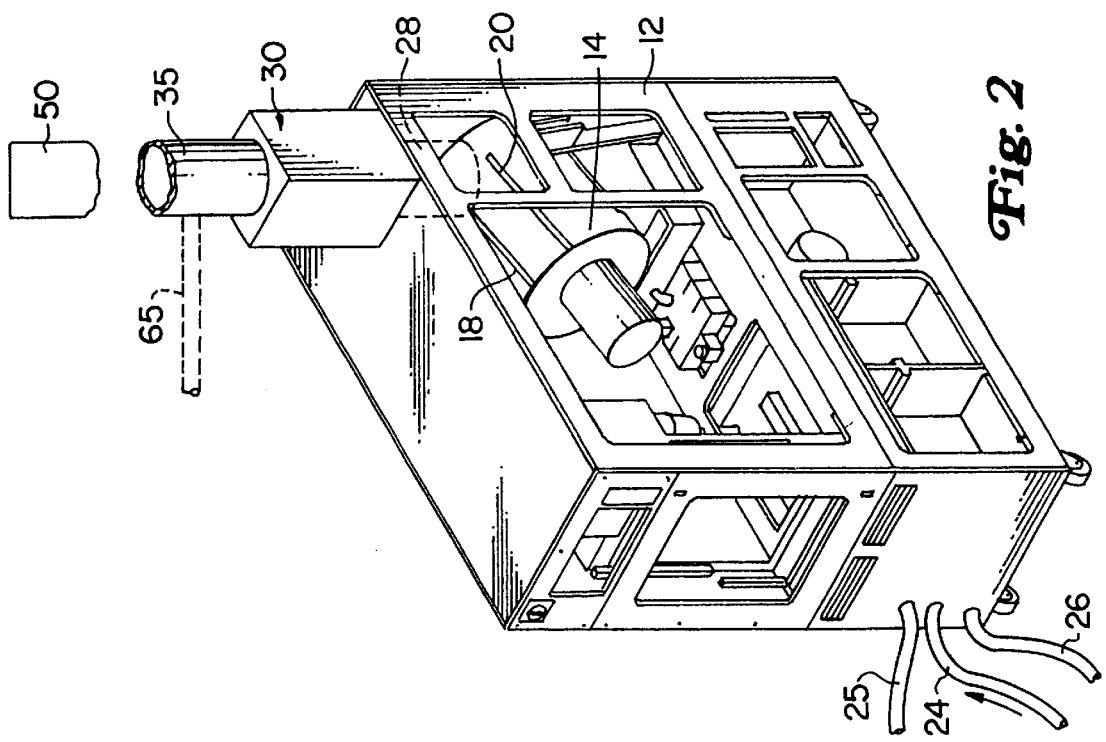

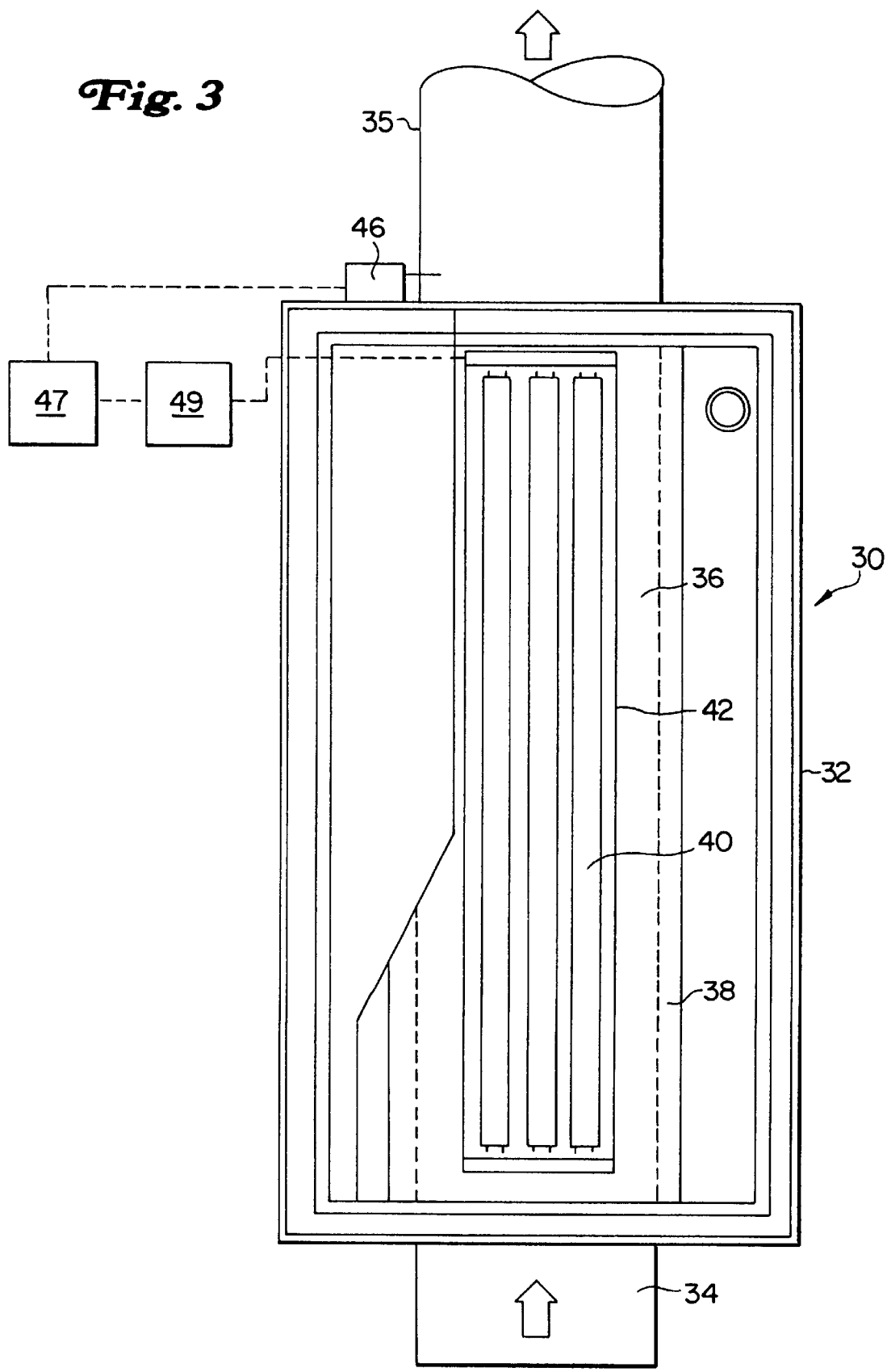

METHOD OF OZONE CONVERSION IN SEMICONDUCTOR MANUFACTURING

This Application is a Divisional of U.S. patent application Ser. No. 09/384,077 filed Aug. 26, 1999 and now U.S. Pat. No. 6,408,535, and incorporated herein by reference.

FIELD OF THE INVENTION

The field of the invention is manufacturing of semiconductors.

BACKGROUND OF THE INVENTION

Semiconductor devices, such as micro-processors, memory chips, and various other electronic devices are manufactured using well-known techniques. These types of electronic devices are typically manufactured from silicon or gallium arsenide wafers, although other materials may be considered as well. Additional electronic products, such as flat panel displays, rigid disk memories, thin film head device substrates, compact disk substrates, etc. are manufactured using similar techniques. These articles are collectively referred to as semiconductor articles.

In manufacturing semiconductor articles, the base materials, such as silicon wafers, are often exposed to various chemicals, to add or remove layers of material; to change the characteristics of the base material; for cleaning; or for other purposes. These processing steps are often carried out by spinning the semiconductor articles within a processing chamber. Liquid and gas phase chemicals are sprayed onto, or otherwise applied to, the semiconductor articles in the processing chamber. After a predetermined time, the liquid processing chemicals are drawn off and out of the chamber, usually at the bottom of the chamber, while the gases and/or vapors, are separately drawn or pumped out of the chamber and then vented to the outside.

For certain processing steps, a high concentration of ozone is introduced into the processing chamber, typically for a brief interval of e,g., 5–20 seconds. The ozone is then removed from the processing chamber (typically along with other chemicals, such as acid vapors) and then exhausted to the atmosphere.

However, ozone is a highly chemically reactive gas. In high concentrations, it can become toxic to humans. The exhaust mixture of ozone and acid vapors can therefore be both toxic, and highly corrosive. Consequently, handling the gas exhaust from a processing chamber may require special procedures. For example, components such as ducts, etc. generally must be made of polypropylene or other plastics which resist corrosion. Leak detectors may also be employed to detect any leaks in the pipes or ducts carrying the exhaust gases from the processing chamber to the outside.

In addition, ozone is typically produced using electrical corona discharge equipment, which makes $O_3$ from oxygen $O_2$. While ozone can be made from the oxygen in air, ozone production can be increased using concentrated oxygen (e.g., from bottled oxygen gas), although this increases manufacturing costs. Similarly, in semiconductor processing methods where acid vapors are exhausted to the atmosphere, the acid must be replenished, adding to manufacturing cost.

Accordingly, it is an object of the invention to provide an improved apparatus and method for processing semiconductor articles.

SUMMARY OF THE INVENTION

In a first aspect of the invention, a machine for processing semiconductor articles has an ozone remover connected to a processing chamber. As outflow gases including ozone flow out of the processing chamber and into the ozone remover, the ozone is destroyed. The level of ozone in the outflow gases conducted and released to the outside, is reduced.

In a second aspect of the invention, the ozone remover has an ultraviolet light source providing ultraviolet light into a light chamber. Ozone in the outflow gases flowing through the light chamber is converted into oxygen via the ultraviolet light. Preferably, the outflow gases travel in a flow path through the light chamber surrounding the ultraviolet light source. An ozone detector is advantageously provided to switch on the ultraviolet light source when ozone is detected in the ozone remover.

In a third and separate aspect of the invention, a recirculation line is provided to reduce or eliminate release of outflow gases from the processing chamber to the outside environment. A diverter advantageously diverts the outflow gases and vapors from the ozone remover into a recirculation line, during specific processing cycles, or when the presence of certain chemicals is detected in the gases. Oxygen in the recirculation line, created by exposing ozone to UV light in the ozone remover, and any residual ozone in the recirculation line, is optionally separated from other gases or vapors in the recirculation line, and recycled to an ozone source.

BRIEF DESCRIPTION OF THE DRAWINGS

In the drawings, wherein the same reference number denotes the same element throughout the several views:

FIG. 1 is a front perspective view of a semiconductor article processing machine, with the ozone remover of the invention installed.

FIG. 2 is a rear perspective view thereof.

FIG. 3 is a front section view of a first embodiment of the ozone remover shown in FIGS. 1 and 2.

DETAILED DESCRIPTION OF THE DRAWINGS

Figure 4:
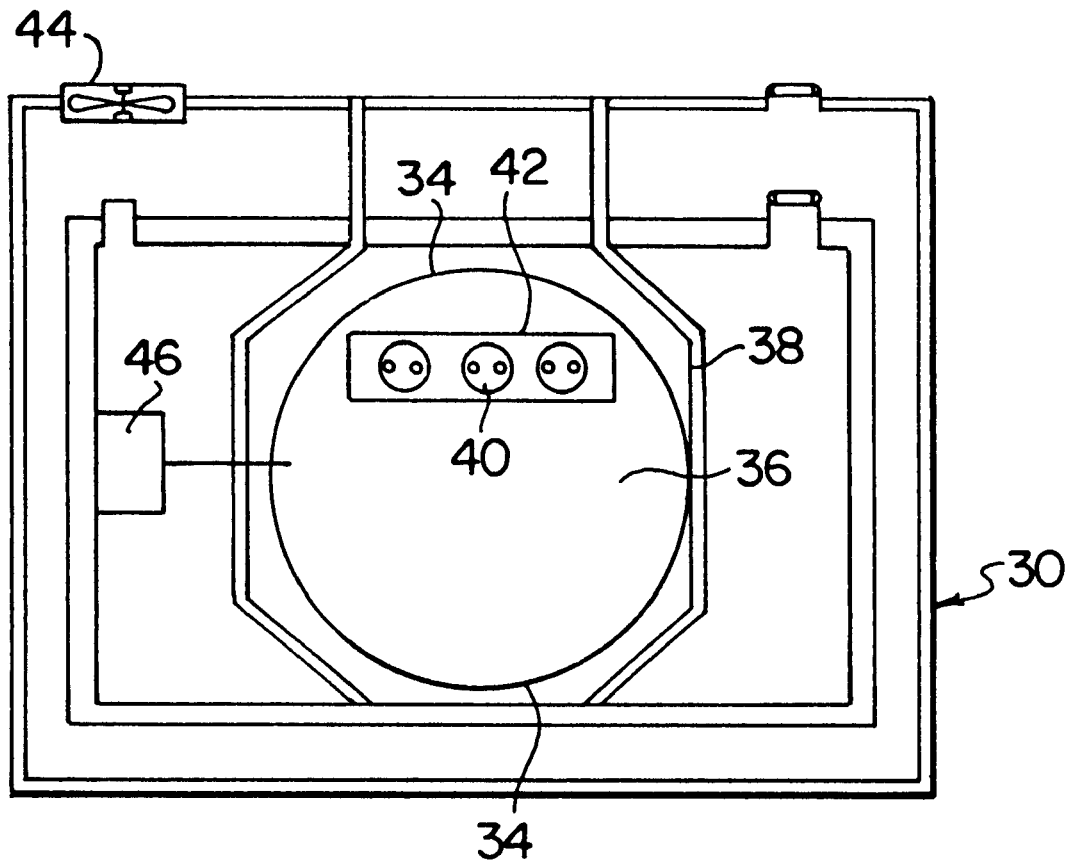
FIG. 4 is a top section view thereof.

As shown in FIGS. 1 and 2, a semiconductor article processing machine 10 has one or more process chambers 14 within a housing 12. A rotor 16 within the process chamber 14 spins the semiconductor articles within the process chamber 14, while liquids and/or gases, e.g., chemicals, de-ionized water, etc., are sprayed or otherwise applied to the semiconductor articles, typically via spray manifolds 18 and 20. A door 22 at the front of the process chamber 14 opens for loading and unloading wafers into and out of the process chamber 14, and also seals the door opening of the process chamber, during processing.

The processing machine 10 may be a spray acid machine, or other processing machine, as are well known in the art.

Referring to FIG. 2, liquid and gas phase chemicals are supplied to the process chamber 14 via supply lines 24 and 25, typically with other additional supply lines used as well. A liquid phase drain line 26 removes used liquids from the machine 10 for subsequent treatment, recycling, or disposal. A gas supply line, such as the supply line 24 supplies ozone (and optionally other gases as well) to the process chamber 14, during specific times of the semiconductor article processing cycle.

Gases or vapors are removed from the process chamber 14 through an outflow duct 28 connected to the process chamber 14 through a valve. The outflow duct 28 preferably extends up and out through the top of the housing 12 of the machine 10. As shown in FIGS. 1 and 2, an ozone remover 30 is provided on top of the housing 12 of the machine 10, with the exhaust duct 28 extending into the ozone remover 30.

Turning now to FIGS. 3 and 4, the ozone remover 30 includes a housing 32, with an inlet 34 at the bottom, and an outlet 35 at the top (both 150 mm diameter ducts in the embodiment shown). A light chamber 36 extends through the housing 32 between the inlet 34 and outlet 35. Reflectors 38 surround the light chamber 36, preferably on all sides. An ultraviolet light source, for example, UV light bulbs 40, are sealed within a bulb enclosure 42 extending through the light chamber 36. The bulb enclosure 42 is preferably made largely of a material transparent to UV light, such as quartz, to allow the UV light to radiate from the UV source or bulbs 40 into the light chamber 36. A blower or fan 44 is optionally provided to increase convective cooling of the housing 32. An ozone sensor 46 is located near the outlet 35. The ozone sensor 46 is electrically connected to a switch or controller 47, which in turn switches on a power supply 49 for the UV bulbs, upon the detection of ozone, with the power supply 49 otherwise turned off.

Referring to FIGS. 1–4, the outlet 35 is joined to a facility exhaust duct 50 which is routed to the outside environment.

As shown in FIG. 4, the flow path through the light chamber 36 (an octagonal duct in the embodiment shown) is largely open and unobstructed, with the UV light source 40 occupying only a small cross sectional area. The UV light source is positioned within the light chamber 36 and reflectors 38 to maximize the intensity of the UV light in the light chamber.

As the machine 10 processes semiconductor articles using various chemicals, potentially including highly corrosive acids, the components of the ozone remover 30 are preferably made of fire-resistant polypropylene.

As an alternative to sealing the ultraviolet bulbs 40 within a bulb enclosure 42, the bulbs 40 may be placed within the light chamber 36, without any enclosure, but with the electrical contacts of the bulbs 40 encapsulated or otherwise sealed, so that gases and vapors flowing through the light chamber 36 cannot come into contact with them.

Referring still to FIGS. 1–4, in use, ozone is provided into the process chamber 14 as part of a processing step for processing semiconductor articles, as is well known. Typically, the duration of peak ozone concentration in the processing chamber is about 5–20 seconds. The ozone may be introduced through a manifold 18 or 20, or through another opening into the process chamber 14. Other gases and vapors are typically also present. At a predetermined time in the process cycle, the gases and vapors in the process chamber 14, including the ozone, are drawn out of the process chamber 14 through the outflow duct 28, and into the light chamber 36 of the ozone remover 30. The upward flow of the gases and vapors is induced by the spinning rotor 16, or optionally via a blower or pump within the machine 10, or connected to the exhaust duct 50 remote from the machine 10.

As the gases and vapors flow into the light chamber 36, the ozone sensor detects ozone, causing the UV bulbs 40 to turn on. UV light floods the light chamber. The intensity of the UV light within the light chamber is increased by the reflectors 38. The UV light changes the ozone into oxygen. Consequently, the gases and vapors passing out of the ozone remover 30 and released into the outside environment through the exhaust duct 50, contain a much lower concentration of ozone than in the past. As a result, the amount of ozone released is significantly reduced.

Figure 5:
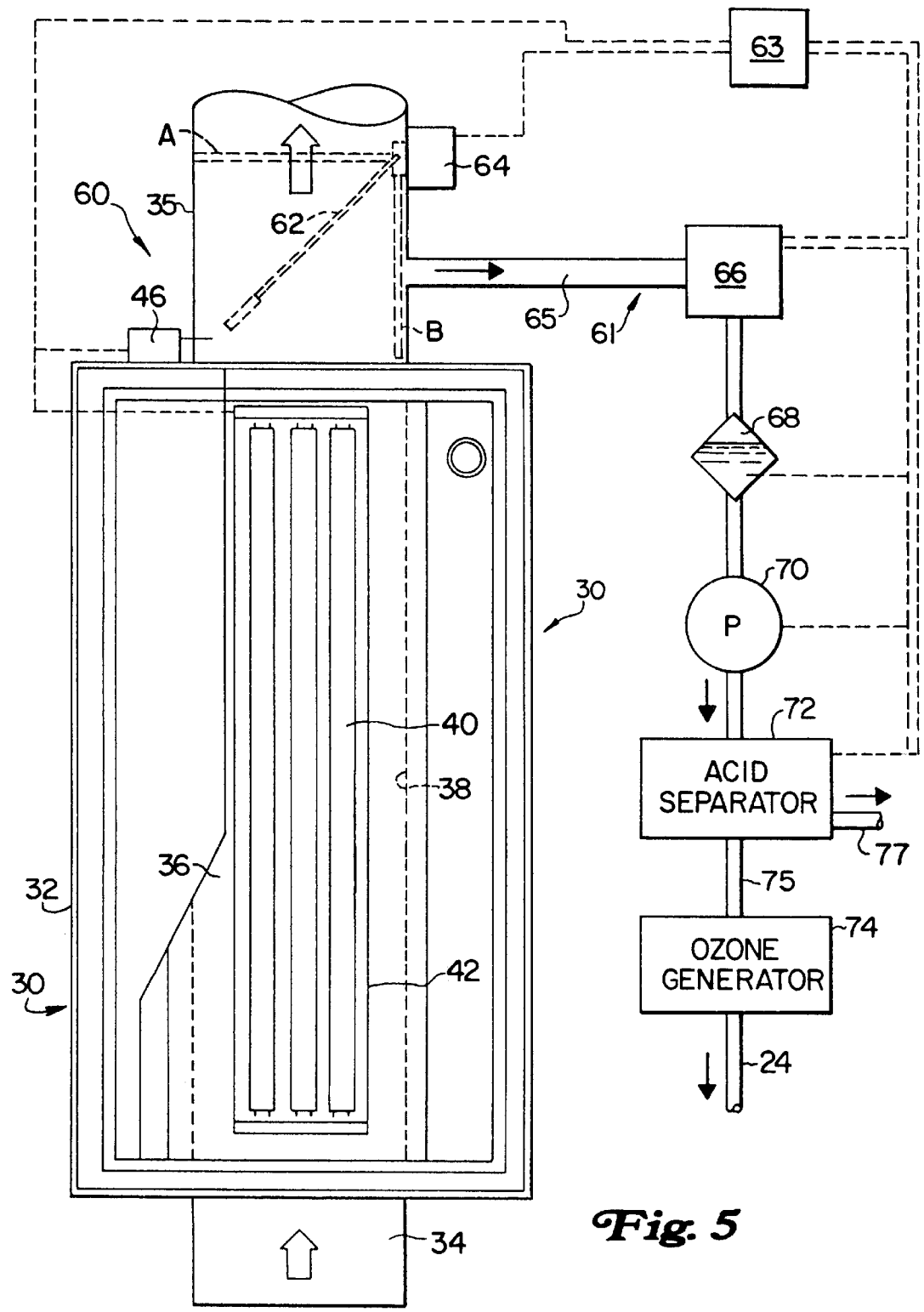
FIG. 5 is a schematic illustration of an ozone handling system, including a recirculation line.
Figure 6:
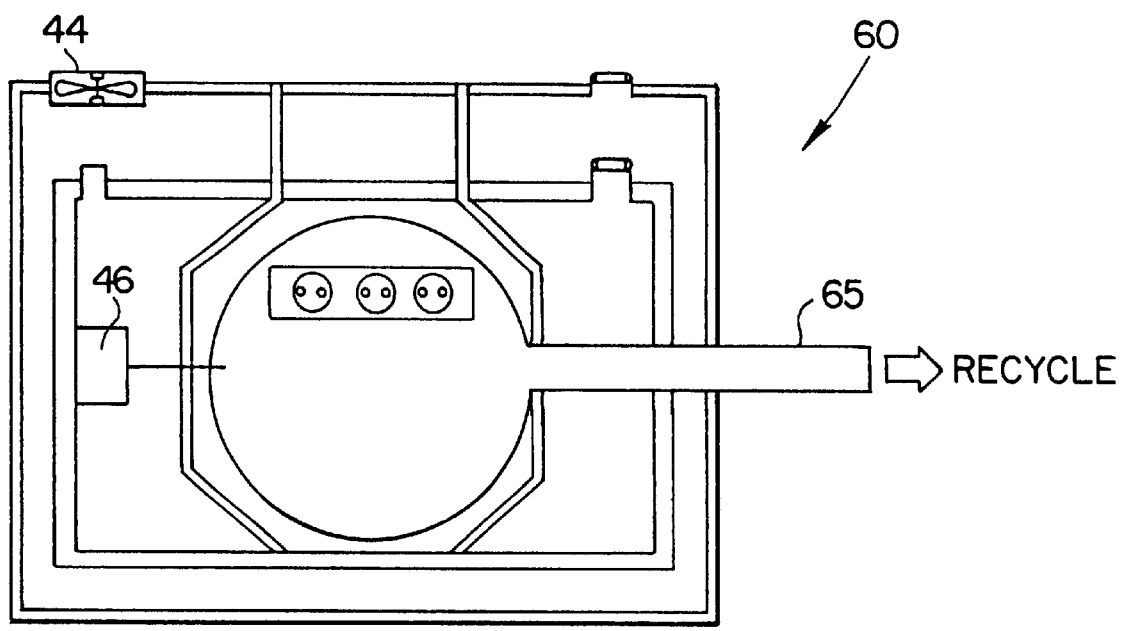
FIG. 6 is a partial top section view thereof.

Turning now to FIGS. 4–6, in an ozone handling system 60, a recirculation line 61 is added. Referring specifically to FIG. 5, a recirculation pipe 65 branches off of the outlet 35. A damper 62 is moved between a first position A and a second position B by a damper actuator 64. With the damper 62 in position A, the outlet 35 is blocked off, so that gases and vapors flowing through the light chamber 36 must flow through the recirculation pipe 65. With the damper 62 in position B, the recirculation pipe 65 is blocked off, and gases and vapors flowing out of the light chamber 36 must flow through the outlet 35 and into the exhaust duct 50.

The recirculation pipe 65 runs from the outlet 35 to a recirculation inlet valve 66, and then through a filter 68, a vacuum pump 70 and into an acid separator 72. The ozone sensor 46, the damper actuator 64, the inlet recirculation valve 66, the vacuum pump 70, and optionally the filter 68 and acid separator 72, are electrically connected to a controller 63.

An oxygen pipe 75 extends from the outlet of the acid separator 72 into an ozone generator 74, which supplies ozone to the machine 10. An acid pipe 77 runs from the acid separator 72 to other collection, processing, recycling or disposal equipment.

In operation, the system 60 operates in the same way as the machine 10 as described above, up until the gases and vapors flowing through the light chamber 36 reach the outlet 35. In the system 60, as shown in FIG. 5, the ozone sensor 46, in addition to causing the UV bulbs 42 to switch on upon detection of ozone, also signals the controller 63. The controller 63 then causes the damper actuator 64 to move the damper 62 to position A. The controller 63 also opens the inlet recirculation valve 66 and turns on the vacuum pump 70. The gases and vapors flowing through the light chamber 36 then flow through the recirculation pipe 65, through the now open inlet recirculation valve 66, the filter 68, through the vacuum pump 70 and into the acid separator 72. The filter 68 is provided to remove water vapor and acid particles.

The acid separator 72 separates acid vapors, as well as other gases and vapors, from oxygen (and any remaining ozone). The separated oxygen and any remaining ozone are pumped through the oxygen line 75 to the ozone generator 74. As the ozone generator 74 requires oxygen to make ozone, the efficiency of the oxygen generator 74 is increased, without a separate oxygen source (e.g., bottled gas). Ozone created by the ozone generator 74 is provided to the process chamber 14, when needed through the ozone supply line 24. The other gas and vapor components separated from the oxygen in the acid separator 72 are drawn off through the acid pipe 77, for separate treatment and handling.

As a result, the gas and vapor emissions to the environment are reduced. In addition, as oxygen and ozone, and acids, are recycled, the amount of processing chemicals/gases is also reduced.

Thus, a novel semiconductor processing machine and processing method have been described. Various changes and modifications, and substitutions of equivalents, may be made without departing from the spirit and scope of the invention. The invention, therefore, should not be limited, except by the following claims, and their equivalents.

What is claimed is:

1. A method for processing semiconductor articles, using ozone, comprising the steps of:

introducing ozone into a processing chamber containing the articles;

moving gases in the processing chamber, including the ozone, out of the processing chamber and into a light chamber;

exposing the gases, including the ozone, to UV light in the light chamber, to destroy ozone; and moving the gases out of the light chamber and into an exhaust duct.

2. The method of claim 1 further comprising the steps of:

monitoring for the presence of ozone in at least one of the processing chamber and the light chamber; and switching on a UV light source in the light chamber when ozone is detected.

3. The method of claim 1 further comprising the step of cooling the light chamber by circulating air around it.

4. The method of claim 1 further comprising the step of allowing the gases to vent to the atmosphere.

5. The method of claim 1 further comprising the step of reflecting the UV light within the light chamber.

6. The method of claim 1 further comprising diverting the gas flow to a facility exhaust duct or to a recirculation line.

7. The method of claim 6 further comprising separating out acid vapor in the recirculation line from the gas flow.

8. The method of claim 2 further comprising actuating a diverter to divert gas flow into a recirculation line, when absence of ozone is detected.

9. A method for processing semiconductor articles, comprising the steps of:

introducing ozone from an ozone source into a processing chamber containing the articles;

moving gases in the processing chamber, including the ozone, out of the processing chamber and into a light chamber;

exposing the gases, including the ozone, to UV light, in the light chamber;

moving the gases out of the light chamber and into a recirculation line; and separating the gases into at least two components, with one of the components including oxygen produced in the light chamber from the reduction of ozone.

10. The method of claim 9 further comprising the step of supplying the component of the gases containing oxygen to the ozone source.

11. A method for processing semiconductor articles, comprising the steps of:

introducing ozone into a processing chamber containing the semiconductor articles;

moving gases in the processing chamber, including the ozone, out of the processing chamber and into a light chamber;

exposing the gases, including the ozone, to UV light in the light chamber;

moving the gases out of the light chamber;

measuring the amount of ozone remaining in the gases;

directing the gases into one of a facility exhaust duct for release into the atmosphere, or into a recirculation line for additional processing, based on the amount of measured ozone in the gases.

* * * * *